United States Patent [19]

Jeng

[11] Patent Number: 5,728,254

[45] Date of Patent: Mar. 17, 1998

[54] CERAMIC RING FOR GUIDING A WAFER DOWN TO THE LOWER ELECTRODE OF A DRY ETCHER

[75] Inventor: Andy Jeng, Tainan Hsien, Taiwan

[73] Assignee: United Microelectronics Corporation, Taiwan

[21] Appl. No.: 686,546

[22] Filed: Jul. 26, 1996

[30] Foreign Application Priority Data

Jun. 26, 1996 [TW] Taiwan ..................... 85209634

[51] Int. Cl.$^6$ ..................................................... H01L 21/00
[52] U.S. Cl. ............................................................. 156/345
[58] Field of Search ........................... 156/345 P, 345 WH; 438/710; 216/67; 204/298.31, 298.34

[56] References Cited

U.S. PATENT DOCUMENTS 4,816,098  3/1989  Davis et al. ........................ 156/345
5,611,865  3/1997  White et al. ...................... 156/345 X Primary Examiner—William Powell
Attorney, Agent, or Firm—Rabin, Champagne, & Lynt, P.C.

[57] ABSTRACT

A structural configuration for a ceramic ring for guiding a semiconductor wafer down to the lower electrode of a dry etcher having upper and lower electrodes. The ceramic ring includes a base ring, a wall ring rising perpendicular to one surface of the base ring, and more than ten projections located on the top edge surface of the wall ring. Each of the projections includes a first and a second triangular surface, each at one end of the prismatic body and rising from the top edge surface of the wall ring. An inner sloped surface rises from the top edge surface of the wall ring and an outer sloped surface rises from the top edge surface of the wall ring. First and second oblique sloped surfaces rise from the top edge surface of the wall ring, connecting the first and second triangular surfaces to the inner sloped surface, respectively. A trapezoidal surface having four sides, one each joined to the inner and outer sloped surfaces and the first and second oblique sloped surfaces forms an apex surface of the projection.

8 Claims, 4 Drawing Sheets

5,728,254

1

CERAMIC RING FOR GUIDING A WAFER DOWN TO THE LOWER ELECTRODE OF A DRY ETCHER

BACKGROUND OF THE INVENTION

1. Field of the Invention

The invention relates in general to a component of a dry etcher for semiconductor fabrication equipment, and more particularly to a ceramic ring for guiding a semiconductor wafer more smoothly down to a lower electrode of a dry etcher in a semiconductor fabrication process.

2. Description of the Related Art

Dry etching is an etching procedure that employs an etcher chamber containing a low pressure gaseous atmosphere placed under an applied electric field. Due to the presence of the electric field, charged ions or radicals are produced in the gas, creating a plasma. This plasma-containing etcher chamber is then suitable to etch, for example, silicon oxide or nitride layers of a semiconductor wafer.

Dry etching is essential in semiconductor fabrication, because it results in anisotropic characteristics in the etched wafer. Excellent conformity to desired precession patterns in the processed semiconductor configuration result from such dry etching procedures.

One widely used, commercially available, dry etcher is the Tegal 903 dry etcher. Two electrode plates, an upper and a lower, are provided in the etcher chamber for producing ionized gaseous molecules when an electric field is applied thereto.

A brief description of the characteristics of a conventional ceramic ring used for the above-described purpose follows to assist in the understanding of the invention.

Referring to FIG. 1, a perspective view of a prior art ceramic ring 100 observed at approximately a 45-degree angle is shown. As shown, the ceramic ring 100 includes a base ring 101, a wall ring 102, and a number of prism-shaped projections 103,104, . . . , and 112. Typically, the entire ceramic ring is made in one single piece.

With simultaneous reference to FIG. 2, which is a side view of the ceramic ring of FIG. 1, it can be seen that the base ring 101 is generally a disc-shaped ring while the wall ring 102 is a tube-shaped ring. The wall ring 102 rises generally perpendicularly from the inner edge of the disc-shaped base ring 101, and the ceramic ring reveals an L-shaped cross section when cut diametrically. In FIG. 2, it is shown that the two faces of the base ring 101 have different diameters. Essentially, the face of base ring 101 opposite the direction of the rise of the wall ring 102 has a diameter 114 that is smaller than the diameter 113 of the other face, and this forms a tapered outer edge of the base ring 101, as shown in the drawing. The wall ring 102 has an inner opening with a diameter 115.

In one typical example, the base ring 101 has a thickness 126 of about 4.97 mm. Its larger diameter 113 is about 172.40 mm and its smaller diameter 114 is about 167.20 mm. The inner opening diameter 115 of the wall ring 102 is about 151.30 mm. It should be noted that all these diameters 113, 114, and 115 are measured and obtained from concentric circles of the ceramic ring. Wall ring 102 has a height 127 measured from the larger-diameter disc surface of the base ring 101 of about 9.11 mm and a thickness of about 4.00 mm.

Then, as shown in FIG. 3, the top view of the ceramic ring of FIG. 1, a total of ten prismatic projections 103–112 are

2 located on the top ring-edge surface of the wall ring 102. Arrangement of the locations of these ten projections is as follows. Each of the prismatic projection pairs 107 and 108, 108 and 109, 109 and 110, 110 and 111, and 111 and 112 are separated by about 45-degrees measured from the center of the ceramic ring 100. The center point 116 between prismatic projections 103 and 104 along the top edge surface of the wall ring 102 is also separated by about 45 degrees from the projection 112. In a similar manner, the center point 117 between prismatic projections 105 and 106 along the top edge surface of the wall ring 102 is separated by about 45 degrees from the projection 107. Further, the center points 116 and 117 are also 45-degrees apart. The distance between the prismatic projections 103 and 104, as well as between 105 and 106, is about 8.00 mm.

FIG. 4 is an enlarged and detailed view of the portion IV identified in FIG. 3. Since all ten prismatic projections 103–112 have basically the same structural configuration, only one, projection 112, is detailed in this drawing.

The base of prismatic projection 112 has a width that is substantially the same as the width of the wall ring 102 as it rises above the surface of the top edge of the wall ring 102 in the form of a triangular column lying on one of its side surfaces. Quantitatively, the width of the base of the prismatic projection 112 is about 4.00 min. The end triangular surface 118 of the prismatic projection 112 rises from the base when observed from the counterclockwise direction identified by reference numeral 125, as shown in the detailed view. The height of the projection 112 above the top edge surface of the wall ring 102 is about 3.01 mm The two side surfaces 120 and 121 of the triangular column of the projection 112 have base line lengths of about 1.50 and 2.00 mm, respectively, along the longitudinal direction of the column body. The inner side surface 120 has a length shorter than the outer side surface 121, since the prismatic column of the projection is curved substantially in accordance with the circular curvature of the wall ring 102. Two side surfaces 120 and 121 of the triangular column-shaped prismatic projection 112 are joined at the apex line 119.

These ten prismatic projections 103–112 are used to provide adequate and smooth guidance for the silicon wafer in traveling down to the lower electrode of the dry etcher. However, conventional ceramic rings, such as the one described above with reference to FIGS. 1–4 have a short base line length for their guiding sloped surfaces. In fact, in the case of the conventional ceramic ring of FIGS. 1–4, the lengths of the base lines of the inner and outer side surfaces 120 and 121 of the prismatic projection 112 are too short. These short base lengths result in excessive stress generated against the guiding prismatic projections when wafers are sliding downward guided by these projections. The guiding projections are therefore easily broken, and broken guiding projections misguide, rather than properly guide the wafers.

When such misguidance of the wafer down to the dry etcher lower electrode occurs, the continuous fabrication procedure must be disrupted, and, if the wafer has not reached its correct position over the surface of the bottom electrode of the etcher, photoresist burn may develop. Further, ten or fewer guiding prismatic projections do not smoothly guide the wafers to correctly descend to the lower electrode of the dry etcher.

SUMMARY OF THE INVENTION

It is therefore an object of the invention to provide a ceramic ring for more smoothly guiding a semiconductor wafer down to the lower of two electrodes of a dry etcher in a semiconductor fabrication process.

The invention achieves the above-identified object by providing a structural configuration for a ceramic ring for guiding a semiconductor wafer down to the lower electrode of a dry etcher having upper and lower electrodes. The ceramic ring includes a base ring, a wall ring rising substantially perpendicular to one surface of the base ring, and more than ten projections located on the top edge surface of the wall ring. Each of the projections includes a first and a second triangular surface, each at one end of the projection rising above the top edge surface of the wall ring. An inner sloped surface of the projection rises above the top edge surface of the wall ring and an outer sloped surface of the projection also rises above the top edge surface of the wall ring. First and second small sloped surfaces rise above the top edge surface of the wall ring, each spanning between the triangular surfaces and the inner sloped surface, respectively. A trapezoidal surface having four sides, one each joined to the inner and outer sloped surfaces and the first and second small sloped surface forms the top apex surface of the projection.

More particularly, the invention is directed to an improvement in a dry etcher having an upper electrode and a lower electrode, and a ceramic ring for guiding a semiconductor wafer to be etched down to the lower electrode. The ring includes a base ring, a wall ring rising substantially perpendicular to one face of the base ring, and a number of projections located on the top edge surface of the wall ring. The improvement includes a first triangular surface at one end of the projection, rising above the top edge surface of the wall ring; a second triangular surface generally parallel to the first triangular surface at the other end of the projection rising above the top edge surface of the wall ring; an inner sloped surface rising above the top edge surface of the wall ring; an outer sloped surface rising above the top edge surface of the wall ring; a first oblique sloped surface rising above the top edge surface of the wall ring and connecting the first triangular surface to the inner sloped surface; a second oblique sloped surface rising above the top edge surface of the wall ring and connecting the second triangular surface to the inner sloped surface; and an apex surface having four sides, one each joined to the inner sloped surface, the outer sloped surface, the first small sloped surface, and the second small sloped surface.

BRIEF DESCRIPTION OF THE DRAWINGS

Other objects, features, and advantages of the invention will become apparent from the following detailed description of the preferred, but non-limiting, embodiments. The description is made with reference to the accompanying drawings in which.

DESCRIPTION OF THE PREFERRED EMBODIMENT

Figure 1:
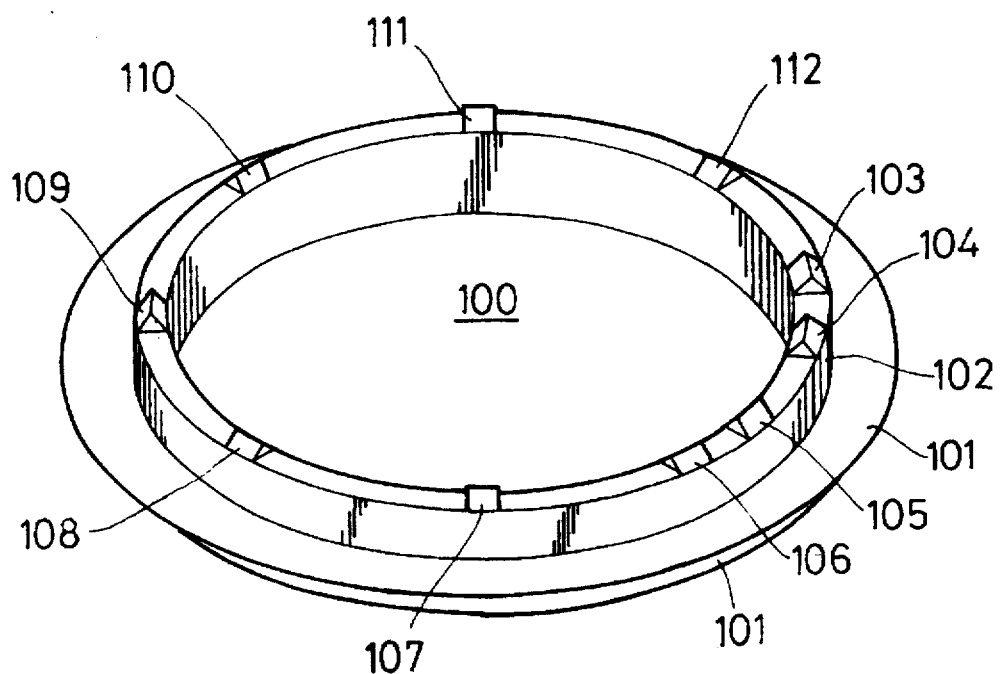
FIG. 1 is a perspective view of a prior art ceramic ring observed at approximately a 45-degree angle.
Figure 2:
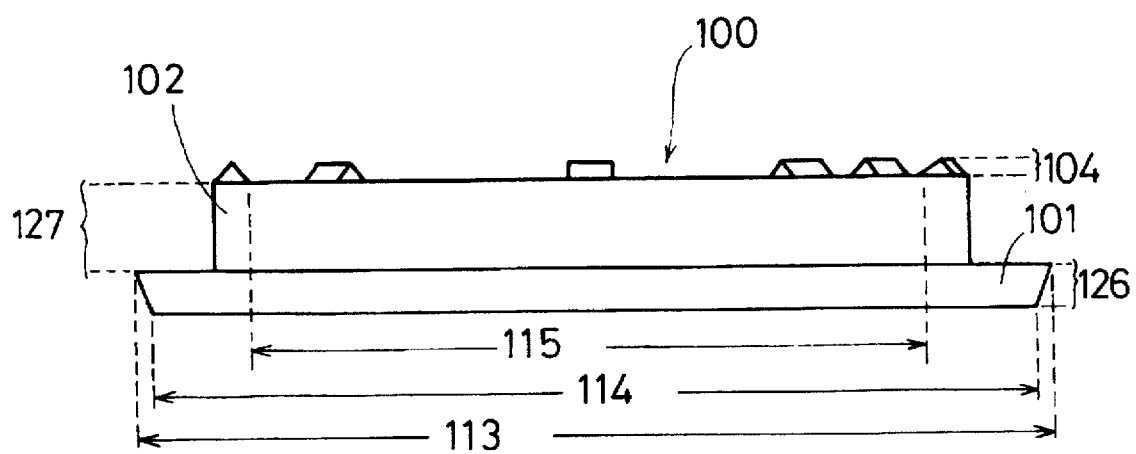
FIG. 2 is a side view of the ceramic ring of FIG. 1.
Figure 4:
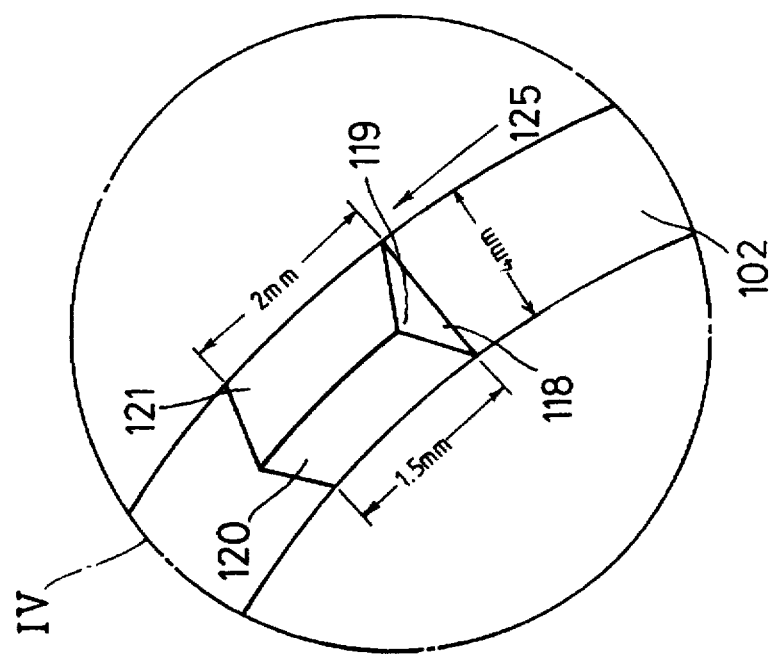
FIG. 4 is an enlarged and detailed view of the portion IV identified in FIG. 3.
Figure 3:
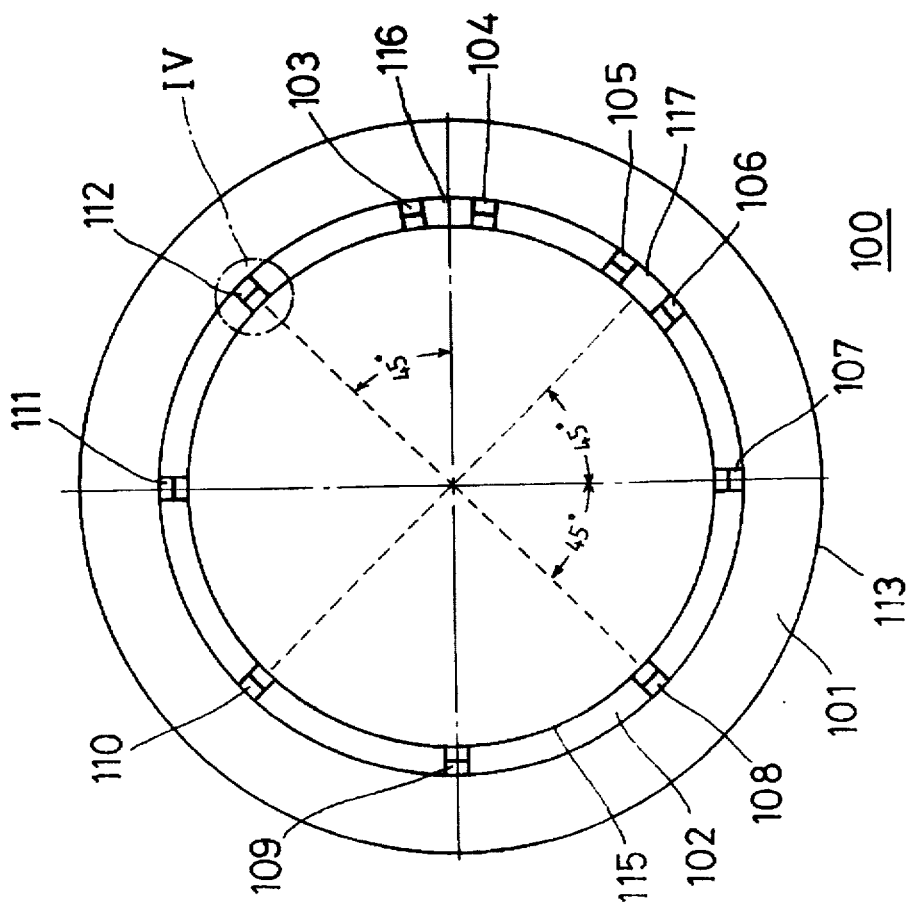
FIG. 3 is a top view of the ceramic ring of FIG. 1.
Figure 5:
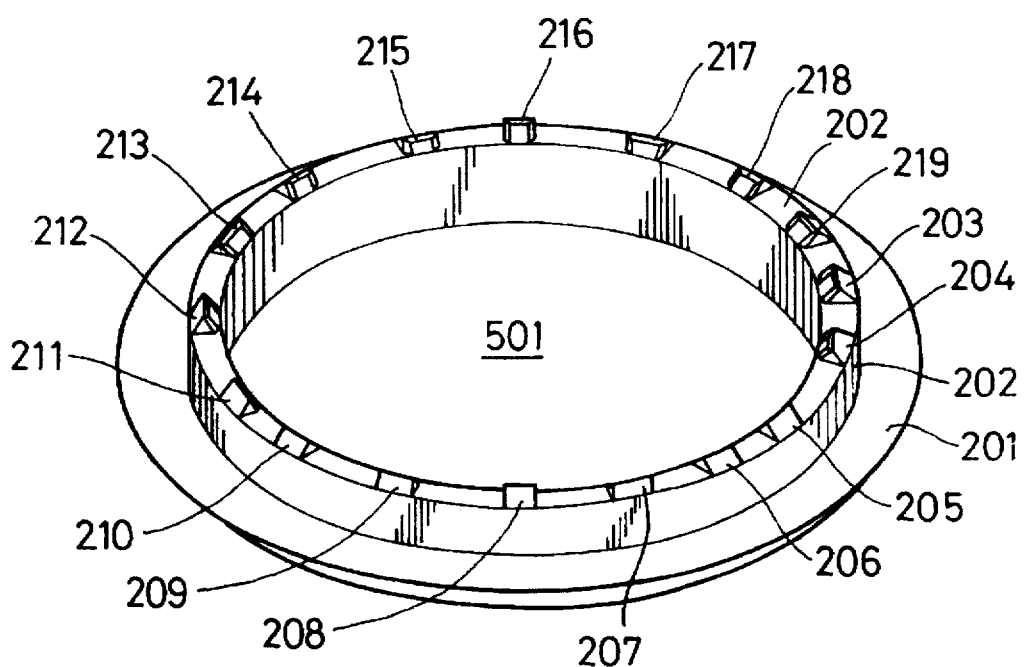
FIG. 5 is a perspective view of a ceramic ring made in accordance with a preferred embodiment of the invention as observed at approximately a 45-degree angle.

FIG. 5 shows a perspective view of a ceramic ring 501 as observed at approximately a 45-degree angle according to a preferred embodiment of the invention. The ceramic ring 501 comprises a base ring 201, a wall ring 202, and a number of projections 203, 204, . . . , and 219. The entire ceramic ring is generally made in one single piece integrally.

Figure 6:
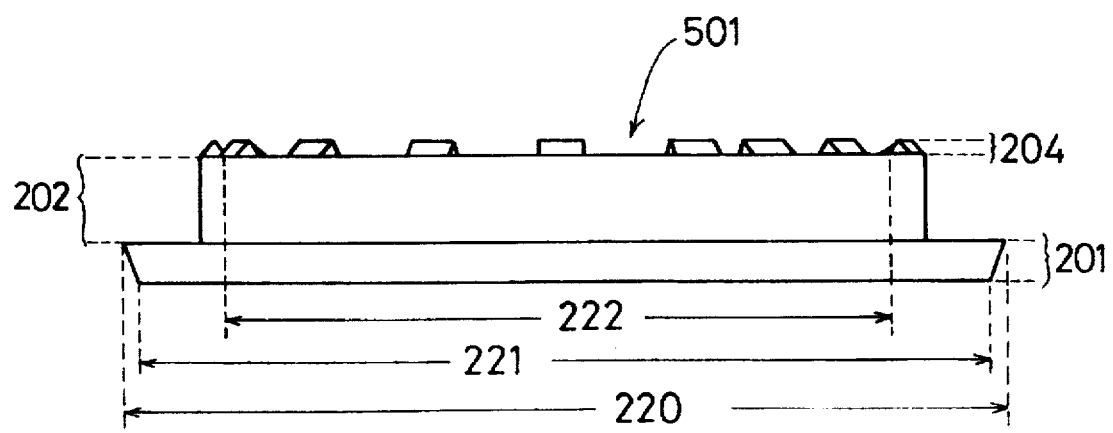
FIG. 6 is a side view of the ceramic ring of FIG. 5.

With simultaneous reference to FIG. 6, the side view of the ceramic ring 501, it can be seen that the base ring 201 is generally a disc-shaped ring while the wall ring 202 is a tube-shaped ring. The wall ring 202 rises generally (approximately) perpendicularly at the inner edge of the disc-shaped base ring 201, and the ceramic ring 501 reveals an L-shaped cross section if cut diametrically. In FIG. 6, it is shown that the two faces of the base ring 201 have different diameters. Essentially, the face opposite the direction of the rise of the wall ring 202 has a diameter 221 that is smaller than the diameter 220 of the other disc face, forming a tapered outer edge of the base ring 201, as shown in the drawing. The wall ring 202 has an inner opening with a diameter 222.

In one preferred embodiment, the base ring 201 has a thickness of about 4.97 mm. Its larger diameter 220 is about 172.40 mm and its smaller diameter 221 is about 167.20 mm. The inner opening diameter 222 of the wall ring is about 151.30 mm. It should be noted that all these diameters 220, 221, and 222 are measured and obtained from concentric circles of the ceramic ring. Wall ring 202 has a height measured from the larger-diameter disc surface of the base ring 201 of about 9.11 mm and a thickness of about 4.00 mm. This embodiment has these dimensions to accommodate a standard size wafer. The dimensions may be altered is a different size wafer is used.

Figure 7:
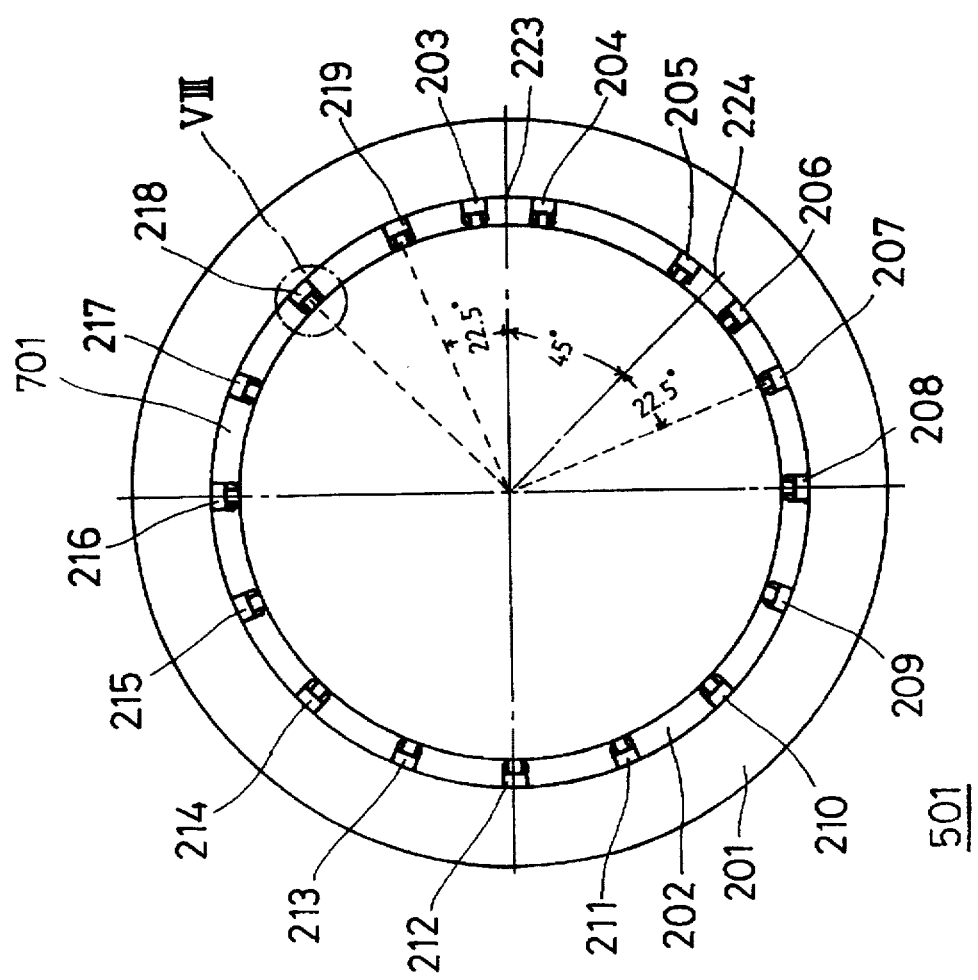
FIG. 7 is a top view of the ceramic ring of FIG. 5.

FIG. 7 shows the top view of the ceramic ring 501 of the invention, having a total of more than ten, e.g., 17, projections 203–219 located on the top ring-edge surface 701 of the wall ring 202. Arrangement of the locations of these 17 projections is as follows. Each of the projection pairs 207 and 208, 208 and 209, . . . , and 218 and 219 are separated by about a 22.5-degree angular distance. The center point 223 between projections 203 and 204 along the top edge surface of the wall ring 202 is also separated by about 22.5 degrees from the projection 219. In a similar manner, the center point 224 between projections 205 and 206 along the top edge surface of the wall ring 202 is separated by about 22.5 degrees from the projection 207. Note, however, that the center points 223 and 224 are about 45-degrees apart. The distance between the projections 203 and 204, as well as between 205 and 206, is about 6.00 mm.

Figure 8:
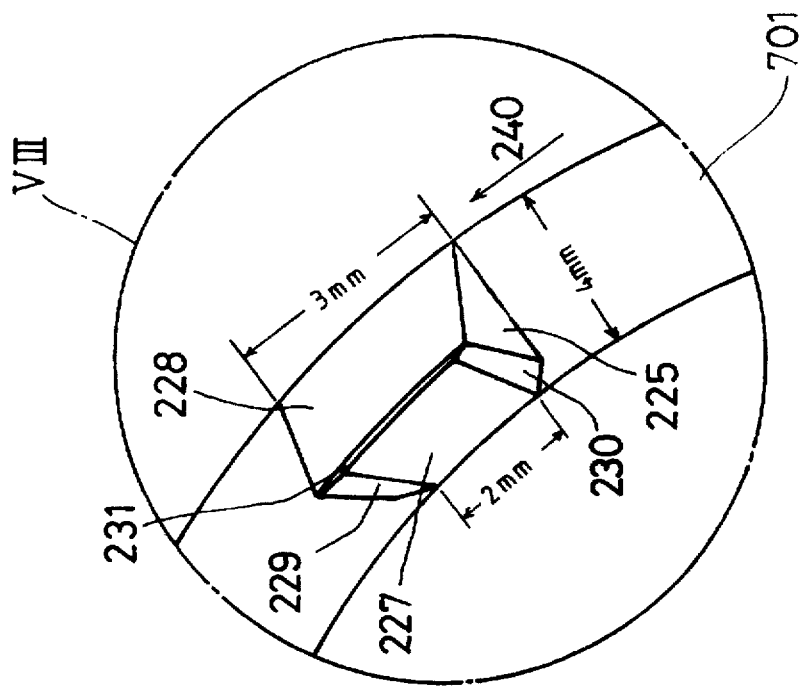
FIG. 8 is an enlarged and detailed view of the portion VIII identified in FIG. 7.

FIG. 8 is an enlarged and detailed view of the portion VIII identified in FIG. 7. Since all 17 projections 203–219 have basically the same structural configuration, only one projection 218 is detailed in this drawing.

The base of projection 218 has a width that is substantially the same as the thickness of the wall ring 202 as it rises from the surface of the top edge of the wall ring 202. In other words, the width of the base of the projection 218 is about 4.00 mm. The end triangular surface 225 of the projection 218 rises from its base when observed from the counter-clockwise direction identified by reference numeral 240, as shown in the detailed view. The height of the projection 218 above the top edge surface of the wall ring 202 is about 3.01 mm.

The two side surfaces 227 and 228 of the projection 218 have lengths of about 2.00 and 3.00 mm, respectively, along the longitudinal direction of the column body. The inner side surface 227 has a length shorter than the outer side surface 228, since the projection is curved substantially in accordance with the circular curvature of the wall ring 202. In addition, two smaller oblique sloped surfaces 229 and 230 are also provided between the inner side surface 227 and the two end triangular surfaces 225 at both ends of the projection 218. Essentially, this prevents the base line of the end triangular surface 225 from reaching the inner edge of the wall ring 202. The same applies to the other end triangular surface at the other end of the projection 218. The two large side surfaces 227 and 228 of the projection 218, as well as the two smaller sloped surfaces 229 and 230, all rise from the top edge surface of the wall ring 202, and all four surfaces are joined at an apex surface 231, which has a trapezoidal shape as shown in the drawing. The apex surface 231 is a trapezoid having a width of 0.6 mm between its two parallel edges.

In accordance with the ceramic ring of the invention as described above with reference to the accompanying drawing of FIGS. 5–8, physical embodiments were made and tested, showing that the guidance down to the lower electrode of the dry etcher provided by the ring of the invention is smoother than that of the prior art counterpart for wafers. Photoresist burn situations were therefore avoided and the fabrication procedure operated more smoothly with improved processing efficiency.

While the invention has been described by way of example and in terms of a preferred embodiment, it is to be understood that the invention is not limited to the disclosed embodiment. To the contrary, it is intended to cover various modifications and similar arrangements. The appended claims, therefore, should be accorded the broadest interpretation so as to encompass all such modifications and similar structures.

What is claimed is:

1. A ceramic ring for guiding a semiconductor wafer down to a lower electrode of a dry etcher, comprising:

a base ring having a surface;

a wall ring rising from and substantially perpendicular to the surface of said base ring, and having a top edge surface; and a plurality of projections located on the top edge surface of said wall ring, each one of said plurality of projections comprising:

a first end and a second end;

a first triangular surface at the first end of said one projection rising from said top edge surface of said wall ring;

a second triangular surface generally parallel to said first triangular surface at the second end of said one projection rising from said top edge surface of said wall ring;

an inner sloped surface rising from said top edge surface of said wall ring;

an outer sloped surface rising from said top edge surface of said wall ring and joined to said first triangular surface at the first end of the projection and to said second triangular surface at the second end of the projection;

a first oblique sloped surface rising from said top edge surface of said wall ring and connecting said first triangular surface to said inner sloped surface;

a second oblique sloped surface rising from said top edge surface of said wall ring and connecting said second triangular surface to said inner sloped surface; and an apex surface having a first side joined to said inner sloped surface, a second side joined to said outer sloped surface, a third side joined to said first oblique sloped surface, and a fourth side joined to said second oblique sloped surface.

2. The ceramic ring of claim 1, wherein said inner sloped surface includes a base line joining said top edge surface of said wall ring, having a length of about 2.00 mm.

3. The ceramic ring of claim 1, wherein said outer sloped surface includes a base line joining said top edge surface of said wall ring, having a length of about 3.00 mm.

4. The ceramic ring of claim 1, wherein said apex surface is a trapezoid.

5. The ceramic ring of claim 1, wherein said apex surface is a trapezoid having a width of about 0.6 mm between the two parallel edges of said trapezoid.

6. The ceramic ring of claim 1, wherein said plurality of projections includes a total of more than 10 projections.

7. The ceramic ring of claim 1, wherein said plurality of projections includes a total of seventeen projections.

8. In a dry etcher having an upper electrode and a lower electrode and a ceramic ring for guiding a semiconductor wafer to be etched down to said lower electrode, said ring comprising a base ring, a wall ring rising from and substantially perpendicular to a surface of said base ring, and a plurality of projections located on a top edge surface of said wall ring, the improvement which comprises:

a first projection end and a second projection end;

a first triangular surface at the first projection end rising from said top edge surface of said wall ring;

a second triangular surface generally parallel to said first triangular surface at the second projection end rising from said top edge surface of said wall ring;

an inner sloped surface rising from said top edge surface of said wall ring;

an outer sloped surface rising from said top edge surface of said wall ring and joined to said first triangular surface and said second triangular surface;

a first oblique sloped surface rising from said top edge surface of said wall ring and connecting said first triangular surface to said inner sloped surface;

a second oblique sloped surface rising from said top edge surface of said wall ring and connecting said second triangular surface to said inner sloped surface; and an apex surface having a first side joined to said inner sloped surface, a second side joined to said outer sloped surface, a third side joined to said first oblique sloped surface, and a fourth side joined to said second oblique sloped surface.

* * * * *